(12) United States Patent
Christmas

(10) Patent No.: US 10,847,068 B2
(45) Date of Patent: Nov. 24, 2020

(54) METHOD OF OPERATING A DISPLAY DRIVER

(71) Applicant: Dualitas Ltd., Knowlhill (GB)

(72) Inventor: Jamieson Christmas, Knowlhill (GB)

(73) Assignee: Dualitas Ltd, Knowlhill (GB)

( * ) Notice: Subject to any disclaimer, the term of this patent is extended or adjusted under 35 U.S.C. 154(b) by 0 days.

(21) Appl. No.: 16/345,688

(22) PCT Filed: Oct. 25, 2017

(86) PCT No.: PCT/GB2017/053221
§ 371 (c)(1),
(2) Date: Apr. 26, 2019

(87) PCT Pub. No.: WO2018/078366
PCT Pub. Date: May 3, 2018

(65) Prior Publication Data
US 2019/0295449 A1 Sep. 26, 2019

(30) Foreign Application Priority Data

Oct. 27, 2016 (GB) .................................. 1618207.3
Dec. 22, 2016 (GB) .................................. 1622021.2

(51) Int. Cl.
*G09G 5/00* (2006.01)
*G09G 3/00* (2006.01)
(Continued)

(52) U.S. Cl.
CPC .............. *G09G 3/002* (2013.01); *G03H 1/02* (2013.01); *G03H 1/08* (2013.01); *G03H 1/16* (2013.01);
(Continued)

(58) Field of Classification Search
CPC ... G09G 3/36; G09G 3/30; G09G 5/00; G06F 3/041; G06F 3/045; G06F 3/043; G06F 3/042; G06F 3/038
See application file for complete search history.

(56) References Cited

U.S. PATENT DOCUMENTS 5,847,688 A 12/1998 Ohi
6,956,512 B1 10/2005 San
(Continued)

FOREIGN PATENT DOCUMENTS

JP 2001147673 A 5/2001
JP 2005269110 A 9/2005
(Continued)

OTHER PUBLICATIONS

International Search Report for International Application No. PCT/GB2017/053221 dated Jan. 18, 2018, 2 pages.
Written Opinion for International Application No. PCT/GB2017/053221 dated May 3, 2018, 10 pages.

*Primary Examiner* — Pegeman Karimi
(74) *Attorney, Agent, or Firm* — McDonnell Boehnen Hulbert & Berghoff LLP

(57) ABSTRACT

A method of operating a display device comprising a drive circuit is disclosed. The drive circuit comprises a plurality of single grey-level channels, each comprising an input (412, 422), an output (418, 428) and a signal processor connected between the input and output. Each signal processor comprises a digital-to-analog converter (414, 424) and an operational amplifier (416, 426) having a voltage offset. The method comprises: converting a digital signal received at the input (412, 422) into an analog voltage (410, 420) at the output (418, 428) using each respective signal processor; switching between the analog voltage (410, 420) of each single grey-level channel using a switching circuit (430); receiving and analysing the analog voltages (410, 420) in a calibration subsystem (440), and individually compensating (Continued)

for the voltage offset of each op-amp (416, 426) based on the received analog voltage (410, 420) for that grey-level channel using the calibration subsystem (440).

17 Claims, 8 Drawing Sheets

(51) Int. Cl.
| | | |
|---|---|---|
| *G03H 1/08* | (2006.01) | |
| *G03H 1/16* | (2006.01) | |
| *G03H 1/22* | (2006.01) | |
| *G09G 3/20* | (2006.01) | |
| *G03H 1/02* | (2006.01) | |
| *G09G 3/36* | (2006.01) | |
| *H03M 1/66* | (2006.01) | |

(52) U.S. Cl.
CPC ........... *G03H 1/2294* (2013.01); *G09G 3/003* (2013.01); *G09G 3/20* (2013.01); *G09G 3/3688* (2013.01); *G03H 2001/0224* (2013.01); *G03H 2001/0816* (2013.01); *G03H 2225/32* (2013.01); *G03H 2240/11* (2013.01); *G09G 2310/027* (2013.01); *G09G 2310/0235* (2013.01); *G09G 2310/0297* (2013.01); *G09G 2320/0233* (2013.01); *G09G 2320/0693* (2013.01); *G09G 2330/026* (2013.01); *H03M 1/66* (2013.01)

(56) References Cited

U.S. PATENT DOCUMENTS

| | | | |
|---|---|---|---|
| 9,843,338 B1 * | 12/2017 | Newlin | ............... H03M 1/1071 |
| 2003/0164812 A1 | 9/2003 | Lee | |
| 2006/0198009 A1 | 9/2006 | Morita | |
| 2008/0252504 A1 * | 10/2008 | Jeong | ................... G09G 3/3685 |
| | | | 341/144 |
| 2010/0156867 A1 * | 6/2010 | Kim | ..................... G09G 3/3648 |
| | | | 345/208 |
| 2010/0225635 A1 * | 9/2010 | Murahashi | ............. G09G 3/006 |
| | | | 345/213 |
| 2011/0228329 A1 | 9/2011 | Suzuki | |
| 2013/0058048 A1 * | 3/2013 | Choi | ..................... G06F 1/1681 |
| | | | 361/727 |
| 2014/0281388 A1 | 9/2014 | Abdallah | |
| 2015/0035813 A1 * | 2/2015 | Lei | ........................ G09G 3/3208 |
| | | | 345/205 |
| 2015/0042631 A1 * | 2/2015 | Kim | ..................... G09G 3/3655 |
| | | | 345/212 |
| 2015/0187263 A1 | 7/2015 | Yang | |
| 2016/0077367 A1 | 3/2016 | Lo | |

FOREIGN PATENT DOCUMENTS

| | | | |
|---|---|---|---|
| JP | 2005284037 A | 10/2005 | |
| JP | 2008216648 A | 9/2008 | |
| JP | 2010122577 A | 6/2010 | |
| JP | 2012194276 A | 10/2012 | |

* cited by examiner

METHOD OF OPERATING A DISPLAY DRIVER

This application is a U.S. national phase application under 35 U.S.C. § 371 of International Patent Application no. PCT/GB2017/053221, filed Oct. 25, 2017, which claims the benefit of United Kingdom Patent Application no. 1618207.3, filed Oct. 27, 2016, and United Kingdom Application no. 1622021.2, filed Dec. 22, 2016.

FIELD

The present disclosure relates to a drive method for a display device. More particularly, the present disclosure relates to a drive method for a liquid crystal on silicon spatial light modulator. The present disclosure further relates to calibrating an operational amplifier circuit for a plurality of grey-level voltages. Embodiments relate to a method of operating a backplane for a liquid crystal on silicon spatial light modulator. Embodiments relate to a method of calibrating a drive circuit for a liquid crystal on silicon spatial light modulator and a method of compensating for the random offset voltage of operational amplifiers used in the drive circuit for a liquid crystal on silicon spatial light modulator.

BACKGROUND AND INTRODUCTION

Light scattered from an object contains both amplitude and phase information. This amplitude and phase information can be captured on, for example, a photosensitive plate by well-known interference techniques to form a holographic recording, or "hologram", comprising interference fringes. The hologram may be reconstructed by illumination with suitable light to form a two-dimensional (replay image) or three-dimensional holographic reconstruction representative of the original object.

Computer-generated holography may numerically simulate the interference process. A computer-generated hologram, "CGH", may be calculated by a technique based on a mathematical transformation such as a Fresnel or Fourier transform. These types of holograms may be referred to as Fresnel or Fourier holograms. A Fourier hologram may be considered a Fourier domain representation of the object or a frequency domain representation of the object. A CGH may also be calculated by coherent ray tracing or a point cloud technique, for example.

A CGH may be encoded on a spatial light modulator, "SLM", arranged to modulate the amplitude and/or phase of incident light. Light modulation may be achieved using electrically-addressable liquid crystals, optically-addressable liquid crystals or micro-mirrors, for example.

The SLM may comprise a plurality of individually-addressable pixels which may also be referred to as cells or elements. The light modulation scheme may be binary, multilevel or continuous. Alternatively, the device may be continuous (i.e. is not comprised of pixels) and light modulation may therefore be continuous across the device. The SLM may be reflective meaning that modulated light is output from the SLM in reflection. The SLM may equally be transmissive meaning that modulated light is output from the SLM is transmission.

A holographic projector may be provided using the described technology. Such projectors have found application in video projectors, head-up displays, "HUD", and head-mounted displays, "HMD", including near-eye devices, for example.

There is disclosed herein an improved drive solution for a display device such as a spatial light modulator used for projection.

SUMMARY

Aspects of an invention are defined in the appended independent claims.

The inventor has provided an improved drive method for a display device such as a spatial light modulator. Embodiments refer to a LCOS display device by way of example only. The present disclosure is applicable to any display device which requires a plurality of analog voltages to provide a plurality of grey levels or phase-delay levels. Embodiments refer to a drive circuit which provides 128 grey levels by way of example only. The present disclosure is applicable to any number of grey levels.

The drive circuit of the present disclosure uses a plurality of operational amplifiers, "op-amps". However, operational amplifiers experience a random offset voltage which reduces the precision with which their output voltages can be set. The inventor herein discloses a system and method which reduce the voltage error caused by the operational amplifiers. The present disclosure describes a method of individually compensating for the voltage offset experienced by each operational amplifier of a grey-level channel for driving a display device. In embodiments, the method compensates for the voltage offset of each individual operational amplifier by calibrating a parameter of the corresponding operational amplifier to provide a desired or target grey level voltage. In other embodiments, the method compensates for the voltage offset of each individual operational amplifier by determining an input that provides the desired or target grey level voltage based on the output response of the operational amplifier.

The present disclosure relates to a device wherein there is provided a digital-to-analog converter, "DAC"/op-amp pair that forms a signal processor for each grey level voltage. Accordingly, references herein to "calibrating a parameter" or "determining an input" of an operational amplifier of a grey-level channel are intended to encompass calibrating a parameter or determining an input of a signal processor comprising a DAC/op-amp pair, or an individual DAC or op-amp of a signal processor of a grey-level channel.

Embodiments refer to displaying a hologram on the display device by way of example only. The present disclosure is equally applicable to displaying a regular image on the display device. The present disclosure is applicable to displaying any type of information on the display device using a plurality of voltage levels.

Reference is made throughout to "levels" including grey levels, modulation levels and phase-delay levels. The term "levels" is used in this disclosure to mean discrete values. That is, the parameter described may only take a value equal to one of a plurality of discrete values. In other words, the parameter is constrained to particular values. For example, it is understood in the display industry that each pixel of a display may modulate the intensity of light and may be operated at a plurality of grey levels such as 128 grey levels from black to white, or vice versa. Each pixel may be described as a light modulating element operable at a plurality of modulation levels. The light modulating element may be a phase-modulating element operable at a plurality of phase-delay levels such as 0, π/2, π, π/2 and 2π. Reference is made throughout to "grey levels" for convenience and consistency of disclosure only. In embodiments related to phase-modulating pixels, the term "grey levels" could be read as "phase-delay levels". In other words, in these embodiments, each "grey" is a "phase delay". For example, grey level number 1 may be a phase-delay of 0 and grey level number 128 may be a phase-delay of 2π.

Accordingly, references herein to "grey-level channel" refer to a drive path or drive circuit, comprising the above described signal processor comprising a DAC/op-amp pair, which provides a voltage level for driving the pixels of the display at the corresponding discrete grey level. Thus, during a particular display time interval (e.g. frame or sub-frame), a grey-level channel provides a fixed voltage level that is used to drive all of the pixels of the display that are intended to display the corresponding grey level.

The term "hologram" is used to refer to the recording which contains amplitude and/or phase information about the object. The term "holographic reconstruction" is used to refer to the optical reconstruction of the object which is formed by illuminating the hologram. The term "replay field" is used to refer to the plane in space where the holographic reconstruction is formed.

The terms "encoding", "writing" or "addressing" are used to describe the process of providing the plurality of pixels of the SLM with a respect plurality of control values which respectively determine the modulation level of each pixel. It may be said that the pixels of the SLM are configured to "display" a light modulation distribution in response to receiving the plurality of control values.

The term "light" is used herein in its broadest sense. Embodiments are equally applicable to visible light, infrared light and ultraviolet light, and any combination thereof.

Embodiments describe 1D and 2D holographic reconstructions by way of example only. In other embodiments, the holographic reconstruction is a 3D holographic reconstruction. That is, in embodiments, each computer-generated hologram forms a 3D holographic reconstruction.

BRIEF DESCRIPTION OF THE DRAWINGS

Specific embodiments are described by way of example only with reference to the following figures.

The same reference numbers will be used throughout the drawings to refer to the same or like parts.

DETAILED DESCRIPTION OF EMBODIMENTS

The present invention is not restricted to the embodiments described in the following but extends to the full scope of the appended claims. That is, the present invention may be embodied in different forms and should not be construed as limited to the described embodiments.

Terms of a singular form may include plural forms unless specified otherwise.

A structure described as being formed at an upper portion/lower portion of another structure or on/under the other structure should be construed as including a case where the structures contact each other and, moreover, a case where a third structure is disposed there between.

In describing a time relationship—for example, when the temporal order of events is described as "after", "subsequent", "next", "before" or suchlike—the present disclosure should be taken to include continuous and non-continuous events unless otherwise specified. For example, the description should be taken to include a case which is not continuous unless wording such as "just", "immediate" or "direct" is used.

Although the terms "first", "second", etc. may be used herein to describe various elements, these elements are not limited by these terms. These terms are only used to distinguish one element from another. For example, a first element could be termed a second element, and, similarly, a second element could be termed a first element, without departing from the scope of the appended claims.

Features of different embodiments may be partially or overall coupled to or combined with each other, and may be variously inter-operated with each other. Embodiments may be carried out independently from each other, or may be carried out together in co-dependent relationship.

It has been found that a holographic reconstruction of acceptable quality can be formed from a "hologram" containing only phase information related to the original object. Such a holographic recording may be referred to as a phase-only hologram. Embodiments relate to phase-only holography by way of example only. That is, in embodiments, the spatial light modulator applies only a phase-delay distribution to incident light. In embodiments, the phase delay applied by each pixel is multi-level. That is, each pixel may be set at one of a discrete number of phase levels. The discrete number of phase levels may be selected from a much larger palette.

Figure 1:
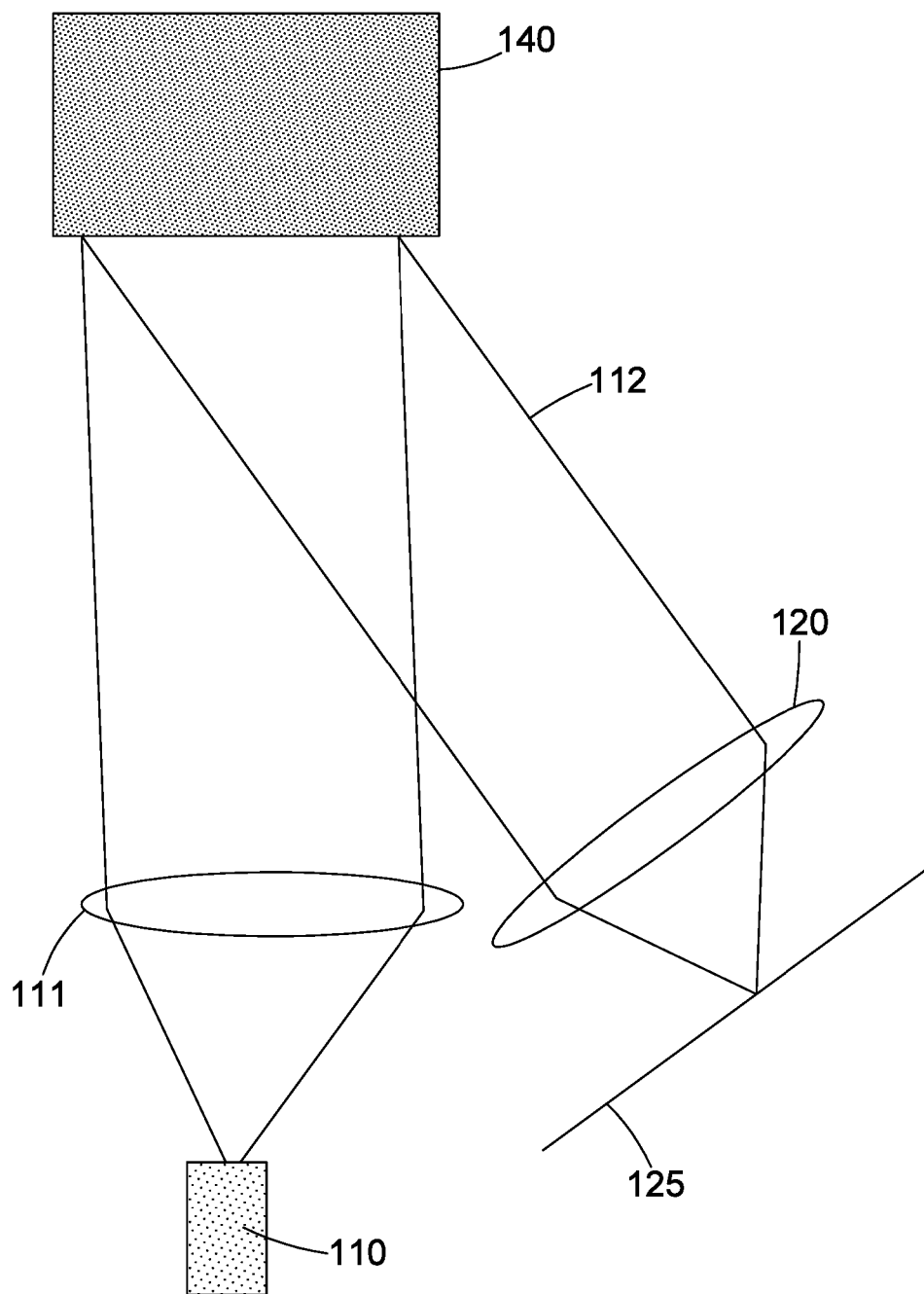
FIG. 1 is a schematic showing a reflective SLM producing a holographic reconstruction on a screen.

In embodiments, the computer-generated hologram is a Fourier transform of the object for reconstruction. In these embodiments, it may be said that the hologram is a Fourier domain or frequency domain representation of the object. FIG. 1 shows an embodiment using a reflective SLM to display a phase-only Fourier hologram and produce a holographic reconstruction at a replay field.

A light source 110, for example a laser or laser diode, is disposed to illuminate the SLM 140 via a collimating lens 111. The collimating lens causes a generally planar wavefront of light to be incident on the SLM. The direction of the wavefront is off-normal (e.g. two or three degrees away from being truly orthogonal to the plane of the transparent layer). In other embodiments, the generally planar wavefront is provided at normal incidence using a beam splitter, for example. In the example shown in FIG. 1, the arrangement is such that light from the light source is reflected off a mirrored rear surface of the SLM and interacts with a phase-modulating layer to form an exit wavefront 112. The exit wavefront 112 is applied to optics including a Fourier transform lens 120, having its focus at a screen 125.

The Fourier transform lens 120 receives a beam of phase-modulated light from the SLM and performs a frequency-space transformation to produce a holographic reconstruction at the screen 125.

Light is incident across the phase-modulating layer (i.e. the array of phase modulating elements) of the SLM. Modulated light exiting the phase-modulating layer is distributed across the replay field. Notably, in this type of holography, each pixel of the hologram contributes to the whole reconstruction. That is, there is not a one-to-one correlation between specific points on the replay image and specific phase-modulating elements.

In these embodiments, the position of the holographic reconstruction in space is determined by the optical power of the Fourier transform lens. In the embodiment shown in FIG. 1, the Fourier transform lens is a physical lens. That is, the Fourier transform lens is an optical Fourier transform lens and the Fourier transform is performed optically. Any lens can act as a Fourier transform lens but the performance of the lens will limit the accuracy of the Fourier transform it performs. The skilled person understands how to use a lens to perform an optical Fourier transform. However, in other embodiments, the Fourier transform is performed computationally by including lensing data in the holographic data. That is, the hologram includes data representative of a lens as well as data representing the object. It is known in the field of computer-generated hologram how to calculate holographic data representative of a lens. The holographic data representative of a lens may be referred to as a software lens. A phase-only holographic lens may be formed, for example, by calculating the phase delay caused by each point of the lens owing to its refractive index and spatially-variant optical path length. For example, the optical path length at the centre of a convex lens is greater than the optical path length at the edges of the lens. An amplitude-only holographic lens may be formed by a Fresnel zone plate. It is also known in the art of computer-generated hologram how to combine holographic data representative of a lens with holographic data representative of the object so that a Fourier transform can be performed without the need for a physical Fourier lens. In embodiments, lensing data is combined with the holographic data by simple vector addition. In embodiments, a physical lens is used in conjunction with a software lens to perform the Fourier transform. Alternatively, in other embodiments, the Fourier transform lens is omitted altogether such that the holographic reconstruction takes place in the far-field. In further embodiments, the hologram may include grating data—that is, data arranged to perform the function of a grating such as beam steering. Again, it is known in the field of computer-generated hologram how to calculate such holographic data and combine it with holographic data representative of the object. For example, a phase-only holographic grating may be formed by modelling the phase delay caused by each point on the surface of a blazed grating. An amplitude-only holographic grating may be simply superimposed on an amplitude-only hologram representative of an object to provide angular steering of an amplitude-only hologram.

A Fourier hologram of a 2D image may be calculated in a number of ways, including using algorithms such as the Gerchberg-Saxton algorithm. The Gerchberg-Saxton algorithm may be used to derive phase information in the Fourier domain from amplitude information in the spatial domain (such as a 2D image). That is, phase information related to the object may be "retrieved" from intensity, or amplitude, only information in the spatial domain. Accordingly, a phase-only Fourier transform of the object may be calculated.

In embodiments, a computer-generated hologram is calculated from amplitude information using the Gerchberg-Saxton algorithm or a variation thereof. The Gerchberg Saxton algorithm considers the phase retrieval problem when intensity cross-sections of a light beam, $I_A(x, y)$ and $I_B(x, y)$, in the planes A and B respectively, are known and $I_A(x, y)$ and $I_B(x, y)$ are related by a single Fourier transform. With the given intensity cross-sections, an approximation to the phase distribution in the planes A and B, $\psi_A(x, y)$ and $\psi_B(x, y)$ respectively, is found. The Gerchberg-Saxton algorithm finds solutions to this problem by following an iterative process.

The Gerchberg-Saxton algorithm iteratively applies spatial and spectral constraints while repeatedly transferring a data set (amplitude and phase), representative of $I_A(x, y)$ and $I_B(x, y)$, between the spatial domain and the Fourier (spectral) domain. The spatial and spectral constraints are $I_A(x, y)$ and $I_B(x, y)$ respectively. The constraints in either the spatial or spectral domain are imposed upon the amplitude of the data set. The corresponding phase information is retrieved through a series of iterations.

In embodiments, the hologram is calculated using an algorithm based on the Gerchberg-Saxton algorithm such as described in British patent 2,498,170 or 2,501,112 which are hereby incorporated in their entirety by reference.

In accordance with embodiments, an algorithm based on the Gerchberg-Saxton algorithm retrieves the phase information $\psi[u, v]$ of the Fourier transform of the data set which gives rise to a known amplitude information $T[x, y]$. Amplitude information $T[x, y]$ is representative of a target image (e.g. a photograph). The phase information $\psi[u, v]$ is used to produce a holographic representative of the target image at an image plane.

Since the magnitude and phase are intrinsically combined in the Fourier transform, the transformed magnitude (as well as phase) contains useful information about the accuracy of the calculated data set. Thus, the algorithm may provide feedback on both the amplitude and the phase information.

Figure 2A:
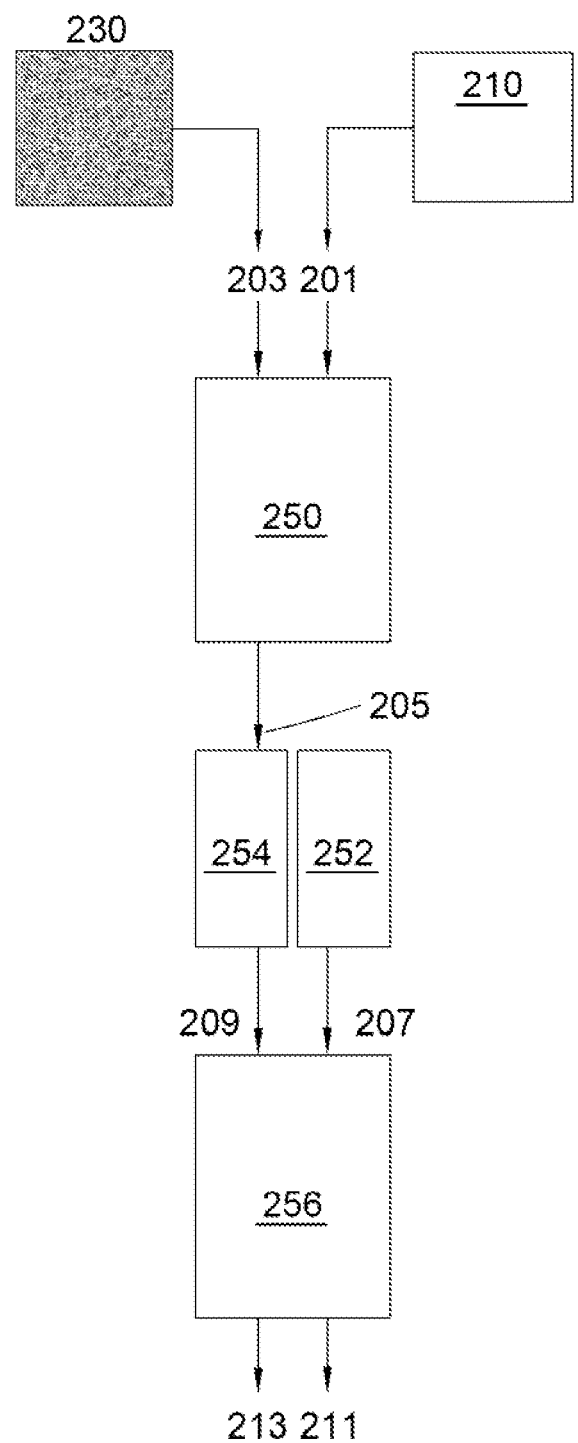
FIG. 2A illustrates a first iteration of an example Gerchberg-Saxton type algorithm.
Figure 2B:
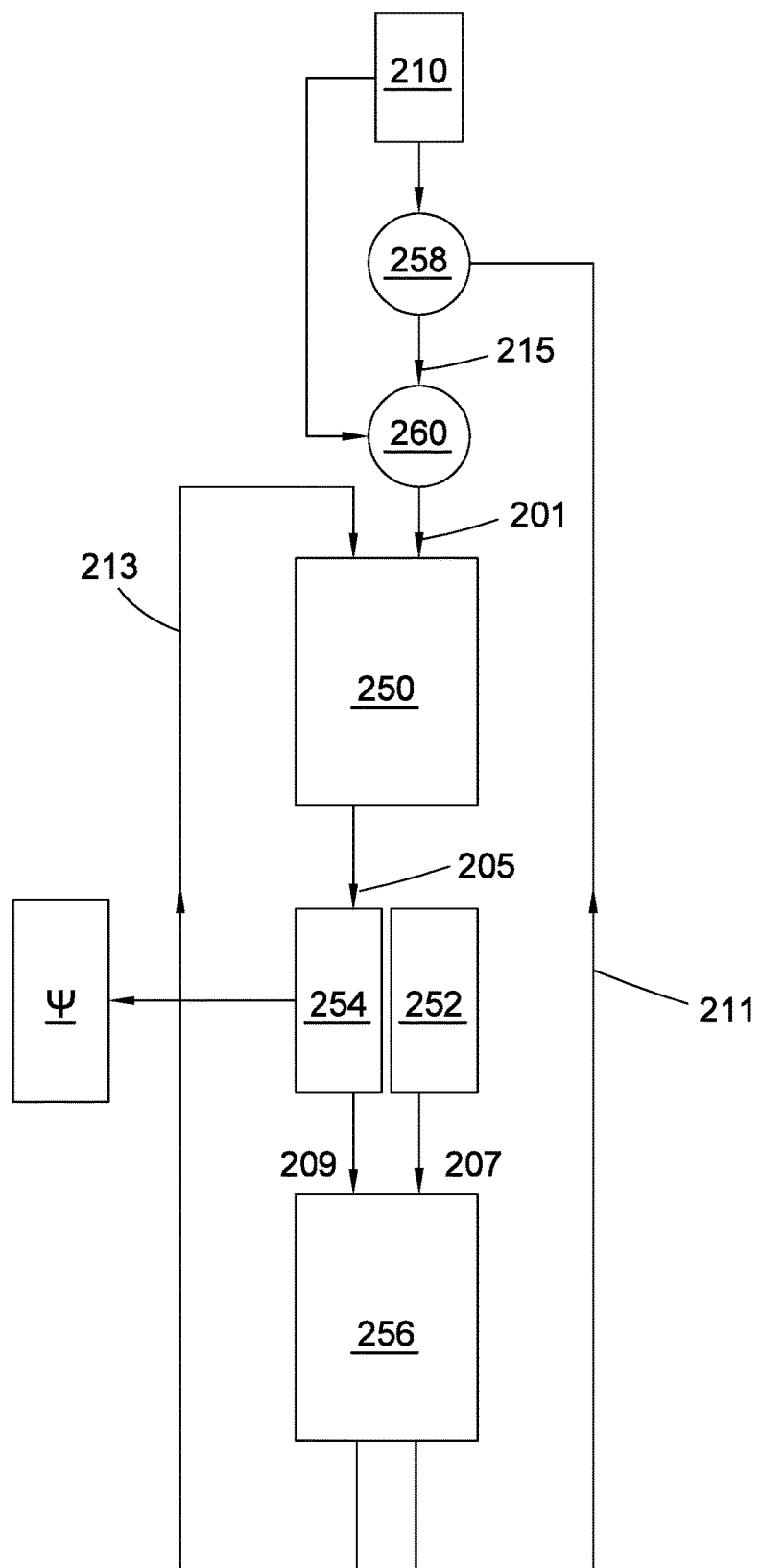
FIG. 2B illustrates the second and subsequent iterations of the example Gerchberg-Saxton type algorithm.

An example algorithm based on the Gerchberg-Saxton algorithm in accordance with embodiments of the present disclosure is described in the following with reference to FIG. 2. The algorithm is iterative and convergent. The algorithm is arranged to produce a hologram representing an input image. The algorithm may be used to determine an amplitude-only hologram, a phase-only hologram or a fully complex hologram. Example disclosed herein relate to producing a phase-only hologram by way of example only. FIG. 2A illustrates the first iteration of the algorithm and represents the core of the algorithm. FIG. 2B illustrates subsequent iterations of the algorithm.

For the purpose of this description, the amplitude and phase information are considered separately although they are intrinsically combined to form a composite complex data set. With reference to FIG. 2A, the core of the algorithm can be considered as having an input comprising first complex data and an output comprising a fourth complex data. First complex data comprises a first amplitude component 201 and a first phase component 203. Fourth complex data comprises a fourth amplitude component 211 and a fourth phase component 213. In this example, the input image is two-dimensional. The amplitude and phase information are therefore functions of the spatial coordinates (x, y) in the farfield image and functions of (u, v) for the hologram field. That is, the amplitude and phase at each plane are amplitude and phase distributions at each plane.

In this first iteration, the first amplitude component 201 is the input image 210 of which the hologram is being calculated. In this first iteration, the first phase component 203 is a random phase component 230 merely used as a starting point for the algorithm. Processing block 250 performs a Fourier transform of the first complex data to form second complex data having a second amplitude component (not shown) and a second phase information 205. In this example, the second amplitude component is discarded and replaced by a third amplitude component 207 by processing block 252. In other examples, processing block 252 performs different functions to produce the third amplitude component 207. In this example, the third amplitude component 207 is a distribution representative of the light source. Second phase component 205 is quantised by processing block 254 to produce third phase component 209. The third amplitude component 207 and third phase component 209 form third complex data. The third complex data is input to processing block 256 which performs an inverse Fourier transform. Processing block 256 outputs fourth complex data having the fourth amplitude component 211 and the fourth phase component 213. The fourth complex data is used to form the input for the next iteration. That is, the fourth complex data of the nth iteration is used to form the first complex data set of the (n+1)th iteration.

FIG. 2B shows second and subsequent iterations of the algorithm. Processing block 250 receives first complex data having a first amplitude component 201 derived from the fourth amplitude component 211 of the previous iteration and a first phase component 213 corresponding to the fourth phase component of the previous iteration.

In this example, the first amplitude component 201 is derived from the fourth amplitude component 211 of the previous iteration as described in the following. Processing block 258 subtracts the input image 210 from the fourth amplitude component 211 of the previous iteration to form fifth amplitude component 215. Processing block 260 scales the fifth amplitude component 215 by a gain factor α and subtracts it from the input image 210. This is expressed mathematically by the following equations:

$$R_{n+1}[x,y]=F'\{\exp(i\psi_n[u,v])\}$$

$$\psi_n[u,v]=\angle F\{\eta \cdot \exp(i\angle R_n[x,y])\}$$

$$\eta=T[x,y]-\alpha(|R_n[x,y]|-T[x,y])$$

Where:
F' is the inverse Fourier transform;
F if the forward Fourier transform;
R is the replay field;
T is the target image;
∠ is the angular information;
ψ is the quantized version of the angular information;
ε is the new target magnitude, ε≥0; and
α is a gain element ~1.

The gain element a may be fixed or variable. In examples, the gain element a is determined based on the size and rate of the incoming target image data.

Processing blocks 250, 252, 254 and 256 function as described with reference to FIG. 2A. In the final iteration, a phase-only hologram ψ(u, v) representative of the input image 210 is output. It may be said that the phase-only hologram ψ(u, v) comprises a phase distribution in the frequency or Fourier domain.

In other examples, the second amplitude component is not discarded. Instead, the input image 210 is subtracted from the second amplitude component and a multiple of that amplitude component is subtracted from the input image 210 to produce the third amplitude component 207. In other examples, the fourth phase component is not fed back in full and only a portion proportion to its change over, for example, the last two iterations is fed back.

In embodiments, there is provided a real-time engine arranged to receive image data and calculate holograms in real-time using the algorithm. In embodiments, the image data is a video comprising a sequence of image frames. In other embodiments, the holograms are pre-calculated, stored in computer memory and recalled as needed for display on a SLM. That is, in embodiments, there is provided a repository of predetermined holograms.

However, embodiments relate to Fourier holography and Gerchberg-Saxton type algorithms by way of example only. The present disclosure is equally applicable to Fresnel holography and holograms calculated by other techniques such as those based on point cloud methods.

The present disclosure may be implemented using any one of a number of different types of SLM. The SLM may output spatially modulated light in reflection or transmission. In embodiments, the SLM is a liquid crystal on silicon (LCOS) SLM but the present disclosure is not restricted to this type of SLM.

A LCOS device is capable of displaying large arrays of phase only elements in a small aperture. Small elements (typically approximately 10 microns or smaller) result in a practical diffraction angle (a few degrees) so that the optical system does not require a very long optical path. It is easier to adequately illuminate the small aperture (a few square centimetres) of a LCOS SLM than it would be for the aperture of a larger liquid crystal device. LCOS SLMs also have a large aperture ratio, there being very little dead space between the pixels (as the circuitry to drive them is buried under the mirrors). This is an important issue to lowering the optical noise in the replay field. Using a silicon backplane has the advantage that the pixels are optically flat, which is important for a phase modulating device.

Figure 3A:
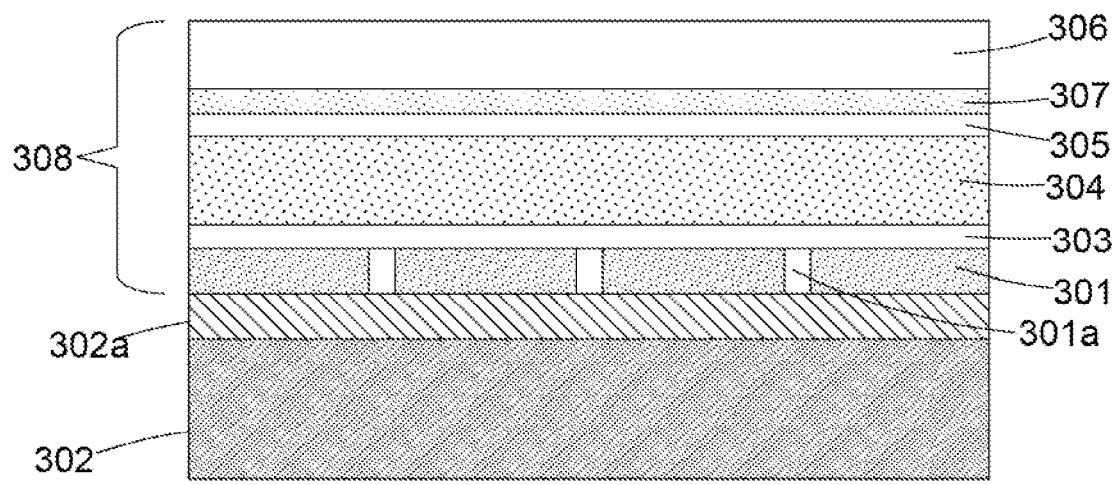
FIG. 3A is a schematic of a reflective LCOS SLM.

A suitable LCOS SLM is described below, by way of example only, with reference to FIG. 3A. An LCOS device is formed using a single crystal silicon substrate 302. It has a 2D array of square planar aluminium electrodes 301, spaced apart by a gap 301a, arranged on the upper surface of the substrate. Each of the electrodes 301 can be addressed via circuitry 302a buried in the substrate 302. Each of the electrodes forms a respective planar mirror. An alignment layer 303 is disposed on the array of electrodes, and a liquid crystal layer 304 is disposed on the alignment layer 303. A second alignment layer 305 is disposed on the liquid crystal layer 304 and a planar transparent layer 306, e.g. of glass, is disposed on the second alignment layer 305. A single transparent electrode 307 e.g. of ITO is disposed between the transparent layer 306 and the second alignment layer 305. Each of the square electrodes 301 defines, together with the overlying region of the transparent electrode 307 and the intervening liquid crystal material, a controllable phase-modulating element 308, often referred to as a pixel. The effective pixel area, or fill factor, is the percentage of the total pixel which is optically active, taking into account the space between pixels 301a. By control of the voltage applied to each electrode 301 with respect to the transparent electrode 307, the properties of the liquid crystal material of the respective phase modulating element may be varied, thereby to provide a variable delay to light incident thereon. The effect is to provide phase-only modulation to the wavefront, i.e. no amplitude effect occurs.

Each of the square electrodes 301 defines, together with the overlying region of the transparent electrode 307 and the intervening liquid crystal material, a controllable phase-modulating element 308, often referred to as a pixel. The effective pixel area, or fill factor, is the percentage of the total pixel which is optically active, taking into account the space between pixels 301a. By control of the voltage applied to each electrode 301 with respect to the transparent electrode 307, the properties of the liquid crystal material of the respective phase modulating element may be varied, thereby to provide a variable delay to light incident thereon. The effect is to provide phase-only modulation to the wavefront, i.e. no amplitude effect occurs.

The described LCOS SLM outputs spatially modulated light in reflection but the present disclosure is equally applicable to a transmissive LCOS SLM. Reflective LCOS SLMs have the advantage that the signal lines, gate lines and transistors are below the mirrored surface, which results in high fill factors (typically greater than 90%) and high resolutions. Another advantage of using a reflective LCOS spatial light modulator is that the liquid crystal layer can be half the thickness than would be necessary if a transmissive device were used. This greatly improves the switching speed of the liquid crystal (a key point for projection of moving video images).

The inventor has provided an improved drive solution for a display device such as a LCOS device. Embodiments refer to a LCOS display device by way of example only. The present disclosure is applicable to any display device which requires a plurality of analog grey-level voltages to provide a plurality of grey levels. Embodiments refer to a drive solution which provides 128 grey levels by way of example only. The present disclosure is applicable to any number of grey levels.

There is provided a method of compensating or adjusting for the voltage offset variation in the LCOS digital to analog converters. The LCOS backplane design of the present disclosure comprises one digital to analog converter per voltage level. Each DAC requires an op-amp, which together form an DAC/op-amp pair (i.e. signal processor). Each op-amp will experience a random offset voltage, which reduces the precision with which the voltage levels can be set. In all cases, the DAC has more bits than grey-levels in the system.

The inventor herein discloses methods for individually compensating for the voltage offset experienced by the operational amplifier of each of the 128 grey-level channels. Embodiments use a switching circuit to enable each of the 128 output voltages to be routed via the switching circuit to an output pin where the linearity and performance is measured. These measurements may be used in conjunction with the target grey level voltage to minimise the voltage error. The voltage accuracy for each phase level Is particularly important for phase-only holographic systems because the voltage error is a phase error which manifests itself as random noise in the image.

Notably, the present disclosure relates to a device wherein there is provided a signal processor comprising a DAC/op-amp pair for each grey-level channel. Each DAC/op-amp pair provides only one output. Specifically, each DAC/op-amp pair is uniquely dedicated to providing just one grey level voltage at any one time, in particular during a given display time interval (e.g. frame or sub-frame). It may therefore be understood that each DAC/op-amp pair provides a single grey-level voltage, corresponding to one of a plurality of grey levels. The present disclosure therefore relates to providing a plurality of single grey-level channels using a corresponding plurality of DAC/op-amp pairs. For example, if the drive circuit is required to produce 128 grey levels, there will be 128 DAC/op-amp pairs of 128 corresponding grey-level channels.

Figure 3B:
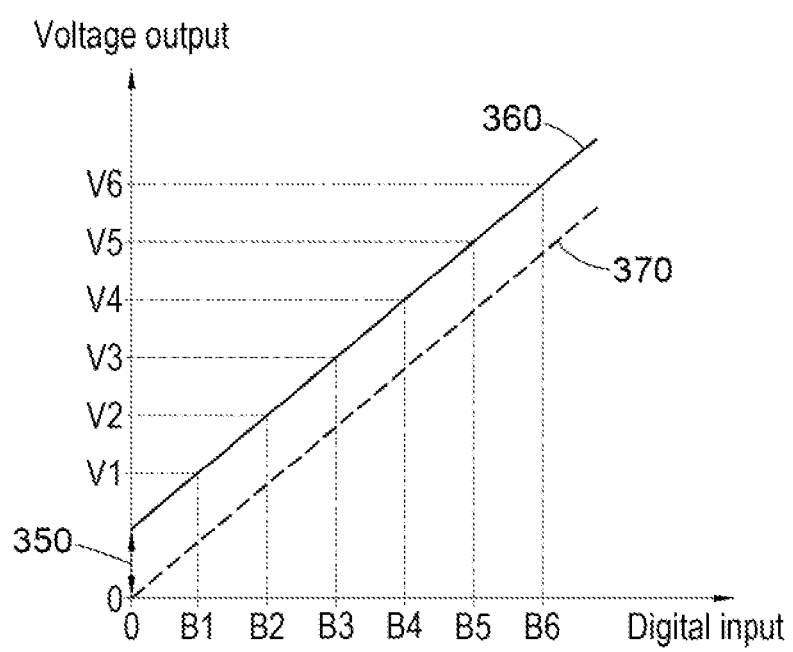
FIG. 3B shows the inherent voltage offset of an operational amplifier in accordance with the present disclosure.

FIG. 3B plots voltage output versus binary input. The response of an ideal DAC/op-amp pair is represented by line 370. However, in practice, a DAC/op-amp pair in accordance with the present disclosure has a response as represented by line 360 owing to imperfections in the manufacturing process of the op-amp. A voltage offset 350 is shown on the y-axis. The voltage offset 350 means that each binary input to the grey-level channel does not give rise to the expected voltage output. Furthermore, each op-amp has a tolerance which manifests itself as a tolerance in the voltage output. In some applications this tolerance in the voltage output is entirely acceptable. However, this tolerance is not acceptable for some applications disclosed herein.

In some embodiments, the display device comprises a plurality of light-modulating pixels wherein each light-modulating pixel is arranged to modulate light by an amount determined by a voltage applied across the active element—for example, liquid crystal—of that pixel.

In some embodiments, the display device comprises a plurality of pixels operable at a plurality of grey levels in accordance with a respective plurality of analog drive voltages, wherein each pixel is selectively-connectable to the output of any one single grey-level channel of the plurality of single grey-level channels. In some embodiments, the pixels comprise liquid crystal. In some embodiments, each pixel is arranged to modulate a parameter of light passing through the pixel, wherein each grey level is a modulation level. In some embodiments, the parameter is phase and each modulation level is a phase-delay level. In some embodiments, the pixels are arranged to operate as individual and independent phase-modulators, optionally, liquid crystal phase-modulators.

The use of liquid crystal as a phase-modulator is well-understood, however, what is less well-known is that the accuracy of phase modulation is directly responsible for the image quality particularly contrast. For a phase-only holographic display, for example, it is of paramount importance to achieve precise voltage control of the liquid crystal which gives rise to the phase modulation. This voltage precision requires a digital to analog converter with a large number of bits and thereby a large number of voltage steps for any given voltage range. For example, in some embodiments, the digital signal received at the input is an 8-bit binary signal. If a particular LCOS backplane design uses one DAC per grey/phase level, then associated with that will be an op-amp circuit to improve the load-driving capability. In some embodiments, each pixel requires a voltage up to 5 V. If 128 evenly spaced grey levels are required, for example, then the grey level voltages should be separated by approximately 40 mV. The offset voltage variation as part of the op-amp characteristics cannot be guaranteed and could be in the range+/−100 mV. If less than 100 mV precision is required (which it is for 128 grey levels) then it is not possible to use this approach. However, the inventor has addressed this problem in order that a DAC/op-amp pair may be used for each grey level with the required voltage precision.

Figure 4:
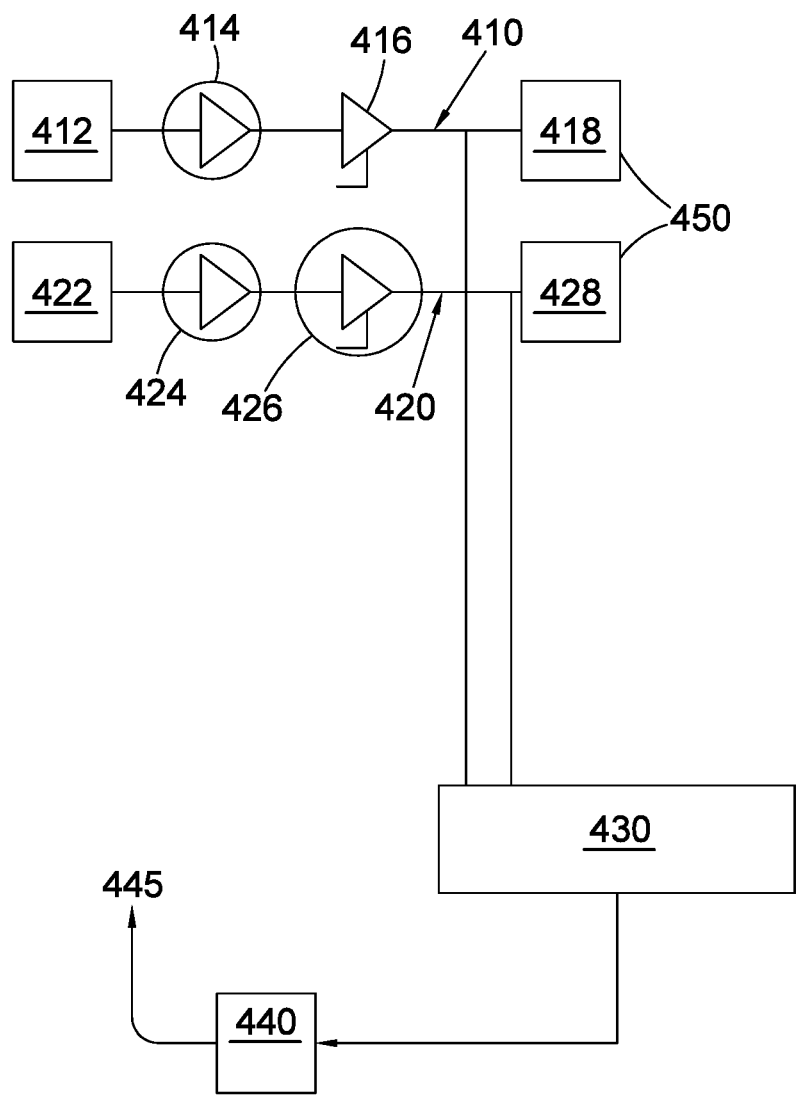
FIG. 4 shows an embodiment comprising two single grey-level channels.

FIG. 4 shows an embodiment comprising a first single grey-level channel 410 and a second single grey-level channel 420. FIG. 4 shows two single grey-level channels by way of example only. It may be understood that the present disclosure extends to any plurality of single grey-level channels, such as 128. As described above, each single grey-level channel is used to provide a voltage level to drive pixels of a display device at one of a plurality of discrete grey levels. First single grey-level channel 410 comprises a first input 412 and first output 418. The first input 412 and first output 418 are connected, in series, by a first DAC 414 and first op-amp 416. First DAC 414 and first op-amp 416 collectively form a first signal processor. Second single grey-level channel 420 comprises a second input 422 and second output 428. The second input 422 and second output 428 are connected, in series, by a second DAC 424 and second op-amp 426. Second DAC 424 and second op-amp 426 collectively form a second signal processor. The first output 418 and second output 428 are connected to switching circuit 430 which is, in turn, connected to a calibration sub-system or circuit 440 outputting a feedback parameter 445.

For example, first input 412 may be hexadecimal signal 0100h. First DAC 414 converts this digital signal to analog and first op-amp 416 provides suitable driving capability. It is known in the art of signal processing how to configure a DAC and op-amp for this purpose and no further description is therefore required here. It is also known that an op-amp can incorporated others components and/or circuitry in order to alter or tune the voltage offset of the op-amp. For example, it is known that an op-amp might include an input voltage offset. The first output 418 provides a voltage arranged to drive a pixel or pixels of the display device at a first grey level.

Likewise, second input 422 may be hexadecimal signal 0101h. DAC 424 converts this digital signal to analog and op-amp 426 provides suitable amplification. The second output 428 provides a voltage arranged to drive a pixel or pixels of the display device at a second grey level.

The first output 418 is therefore a first grey level voltage for the display device. The second output 428 is therefore a second grey level voltage for the display device. It may be understood how the voltage difference between the grey level voltages may be chosen for the particular display device. More specifically, the voltage difference 450 between first output 418 and second output 428 may be chosen based on the working parameters of the display device. In embodiments, 128 grey levels (therefore, 128 single grey-level channels) are provided and the voltage difference 450 between adjacent grey levels (e.g. grey level 0100h and grey level 0101h) may be a few mV. It may be understood how the full working voltage range of the display device may be divided—e.g. evenly divided—between the grey levels.

Switching circuit 430 is configured to receive each voltage output of the single grey-level channels in turn, as part of a calibration process. Calibration sub-system or circuit 440 receives and analyses each received voltage output from switching circuit 430. In particular, calibration sub-system or circuit 440 may compare a received voltage output with a reference voltage for that grey level. For example, the reference voltage may represent a target voltage for that grey level. A look-up table may be used to determine a feedback parameter for the op-amp of each single grey-level channel based on the corresponding output voltage. The feedback parameter directly or indirectly affects or determines the offset voltage of the op-amp. In embodiments, the feedback parameter is a parameter of the op-amp or op-amp circuitry. It is known in the art how an op-amp may have associated components, such as resistors, tuning the behaviour of the op-amp. The op-amp and its associated components may be consider as forming an op-amp circuit. In embodiments, the feedback parameter is the value of an electrical component of the op-amp or op-amp circuit. For example, the feedback parameter may be a voltage, e.g. a voltage for one terminal of the op-amp, or a resistance e.g. the value of a variable resistor forming part of the op-amp circuit. It may be understood how the switching circuit and calibration sub-system or circuit may therefore be used to ensure each single grey-level channel provides the correct voltage output based on the comparison of the received voltage output from a single grey-level channel with a reference voltage and using the feedback parameter. For example, if the voltage output from one single grey-level channel falls, a different feedback parameter may be identified in the look-up table with the effect of adjusting the offset voltage of the associated op-amp in order to increase the grey level voltage. That is, the feedback parameter is used to fine-tune or calibrate the offset voltage of the op-amp for each grey-level channel. Since the op-amp of each single grey-level channel may experience a different voltage offset from the op-amps of the other grey-level channels, as described above with reference to FIG. 3B, the individual calibration of the op-amp for each grey-level channel compensates for the random offset voltage experienced by op-amps. It may therefore be understood that embodiments provide a method of individually compensating for the random offset voltage experienced by each op-amp of a grey-level channel by self-calibrating a drive circuit and display device pair. For example, this calibration process may be run only once upon first switch-on, every time the device is switched on and/or at suitable refresh points and/or run periodically during operation. Each grey level of the drive circuit may therefore be individually calibrated.

There is therefore provided a system including a display device comprising a drive circuit, the drive circuit comprising: a plurality of single grey-level channels, wherein each single grey-level channel comprises an input, an output and a signal processor connected between the input and output, wherein each processor is arranged to convert a digital signal received at the input into an analog voltage at the output, and wherein each signal processor comprises a digital-to-analog converter, "DAC", and an operational amplifier, "op-amp", having a voltage offset; a switching circuit connected to the output of each single grey-level channel, wherein the switching circuit is arranged to switchably-receive the analog voltage of each single grey-level channel of the plurality of single grey-level channels; a calibration sub-system connected to each op-amp, wherein the calibration sub-system is arranged to receive each analog voltage from the switching circuit and individually compensate for the voltage offset of each op-amp based on the received analog voltage for that grey-level channel. The sub-system may be a circuit. The sub-system may be internal or external to the backplane of the display device.

In alternative embodiments, another method of individually compensating for the random offset voltage experienced by each op-amp of a grey-level channel is used. In particular, the voltage output of each DAC/op-amp pair is measured at a plurality of binary inputs (see, for example, V1, V2 . . . V6 in FIG. 3B). These measurements are analysed and stored either in a look-up table or used to calculate an approximation algorithm on a per grey level basis. That is, for each single grey-level channel, the voltage output is measured at a plurality of binary inputs and the measured values are stored. The stored measurements represent the particular voltage or output response of the signal processor comprising the DAC/op-amp pair of each single grey-level channel. The voltage response for each grey-level channel may be analysed and used to provide the correct grey level voltage for that grey-level channel. Therefore, when a specific voltage is required, the required binary input is looked up (or calculated) and the correct voltage is supplied to the display device backplane. This calibration process, comprising analysing the measurements of voltage output in response to a plurality of binary inputs to determine the output response across an operating range, is required on a per piece basis. That is, this calibration process is carried out on each single grey-level channel. FIG. 3B shows an example DAC/op-amp pair exhibiting a linear response by way of example only. It may be understood that each DAC/op-amp pair may exhibit any type of response including a non-linear response, for example. In embodiments, the calibration sub-system or circuit 440 includes an analog-to-digital converter (ADC) and a comparator arranged to compare the output of the ADC with the binary input to the corresponding DAC. These components may be external to the backplane or internal.

It may therefore be understood that, in some embodiments, the calibration sub-system is arranged to individually determine the output response of each single grey-level channel to a plurality of digital inputs and, for each single grey-level channel, determine the digital input required to achieve each analog drive voltage at the output based on the individually-determined output response of the single grey-level channel. The output response of each single grey-level channel may be determined by any means. In some embodiments, the calibration sub-system is arranged to individually determine the output response of each single grey-level channel by measuring the output response of each single grey-level channel to a plurality of digital inputs. In some embodiments, the calibration sub-system is arranged to interpolate between measured output responses of that single grey-level channel.

Figure 5:
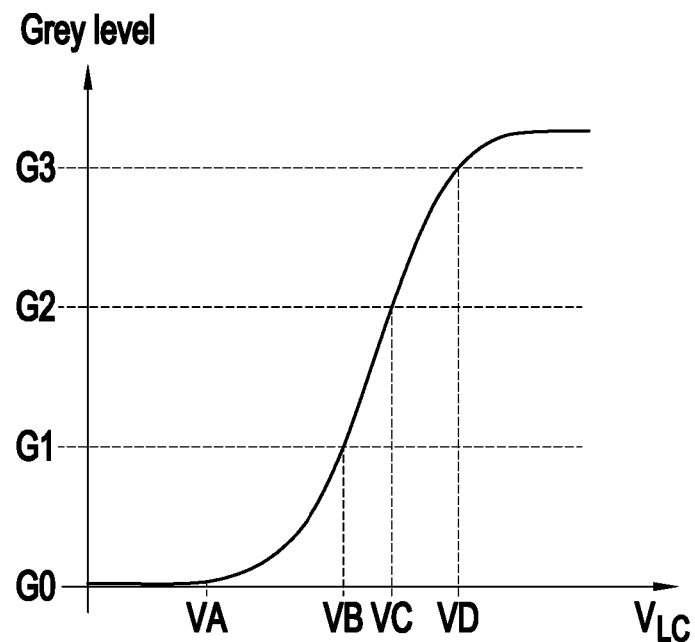
FIGS. 5, 6 and 7 show example responses of a light modulating element, such as a pixel comprising liquid crystal, to voltage.

FIG. 5 shows a first example response of a liquid crystal to voltage, $V_{LC}$. In some embodiments, the response of the pixels to analog voltage is measured. In other embodiments, the grey level response of the pixels is a performance characteristic of the display device defined by a manufacturer, for example. Many liquid crystals do not respond to voltages less than 0.7 V. It may also be seen from FIG. 5, for example, that in order to provide equally-spaced grey levels, the required corresponding voltages are not necessarily equally spaced. FIG. 5 shows four grey levels by way of example only. In some embodiments, 128 grey levels are required but, again, the present disclosure is equally applicable to any number of grey levels. By understanding the response of the liquid crystal and the response of each DAC/op-amp pair, the binary input required to achieve each required (e.g. evenly spaced) grey level may be determined for each single grey-level channel.

In some embodiments, the calibration sub-system is arranged to select the plurality of grey levels based on the grey level response of the pixels to analog voltage, and determine the plurality of analog drive voltages required by the pixels to achieve the respective plurality of grey levels based on the grey level response of the pixels. The grey levels may have a predetermined distribution (e.g. spacing between grey levels) in a range of grey level values, according to application requirements. In some embodiments, the plurality of grey-levels are evenly-spaced between a lower grey-level and an upper grey-level of each pixel, optionally, evenly-spaced between a minimum grey-level and a maximum grey-level of each pixel. However, the present disclosure is not limited in this respect and the grey levels may be unevenly spaced, for example.

Figure 6:
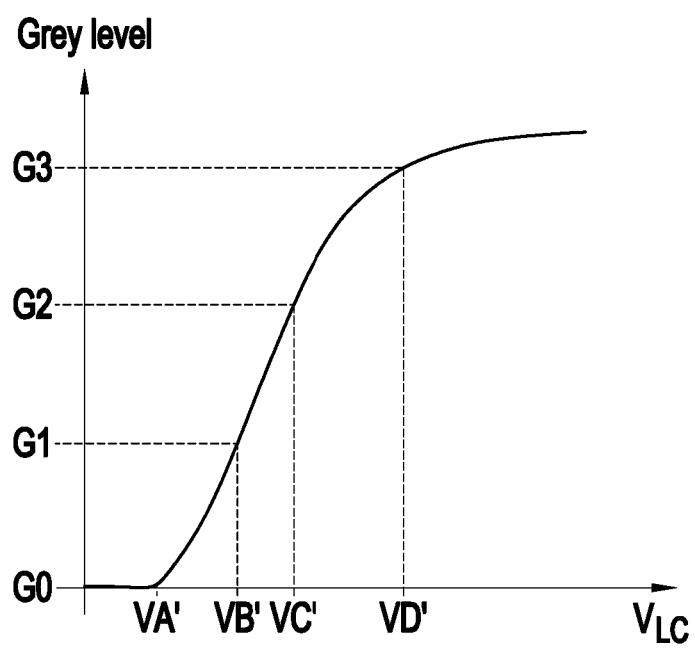

FIG. 6 shows a second example response of a liquid crystal system to voltage, $V_{LC}$. Again, the required voltage to achieve evenly spaced grey levels may be determined and correlated with the measured behaviour of each DAC/op-amp pair to provide a look-up table. In some embodiments, the response behaviour of the liquid crystal is dynamically changeable (e.g. can be manipulated during display). This is achieved because, in embodiments, each single grey-level channel is calibrated over a range. In some embodiments, each single grey-level channel is fully calibrated over its full working range.

Figure 7:
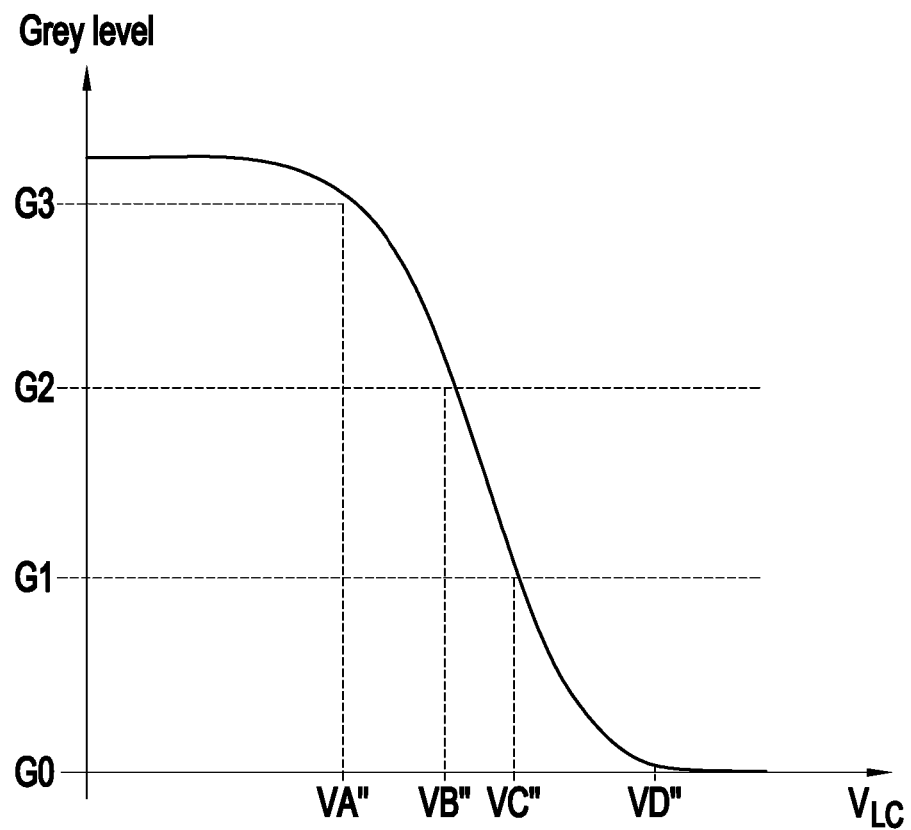

FIG. 7 shows a third example response of a liquid crystal system to voltage, $V_{LC}$. This third example response is substantially inverse to the first example response. For a phase-only image, reversing the liquid crystal response will vertically flip the image.

In accordance with the above alternative embodiments, a method for driving a liquid crystal-based display uses a two-stage calibration process. A first stage selects a plurality of discrete grey levels based on the response of a liquid crystal system. The selected discrete grey levels may be evenly spaced. The grey level response of the liquid crystal system may be measured or otherwise obtained (e.g. from manufacturer data). Based on the pixel response, the process determines the plurality of analog drive voltage required by the liquid crystal pixels to achieve each grey level of the selected plurality of grey levels. In a second stage, the process individually determines the output response of the signal processor comprising a DAC/op-amp pair for each grey-level channel to a plurality of binary input voltages. The process analyses the determined output response of each grey-level channel, and determines the corresponding binary inputs required to provide the plurality of analog drive voltages determined by the first stage. In particular, the second stage correlates the signal processor output response, for each grey-level channel, and the liquid crystal system response from the first stage, and then determines, for each grey-level channel, the binary input voltages required to provide the plurality of analog drive voltages to achieve each of the plurality of grey levels for the liquid crystal system. Thus, each grey-level channel is calibrated across an operating voltage range such as 0 to 5 or 6V. The binary input voltages required for the plurality of grey levels may be stored in a look-up table for each grey-level channel. Thus, each grey-level channel is able to provide an output voltage corresponding to any one of the plurality of discrete grey levels, using the corresponding binary input from the look-up table, and to produce substantially the same pixel response as the other grey-level channels. Thus, the method individually compensates for the random offset voltages experienced by the op-amps of the multiple grey-level channels. The method compensates for variations in the response of different grey-levels channels for a plurality of voltage levels, corresponding to the selected plurality of discrete grey levels (e.g. evenly spaced grey levels). Thus, the method achieves a consistent pixel response to analog output voltages provided by different grey-level channels.

The method according to the alternative embodiments may be performed by a switching circuit 430 and a calibration sub-system 440 as shown in FIG. 4. In particular, switching circuit 430 may be configured to receive the voltage output, in response to each of a plurality of binary input voltages, of each single grey-level channel, in turn. The calibration sub-system 440 may include any suitable processing system configured to receive and analyse the voltage outputs from the switching circuit 430 in accordance with the method. In particular, the calibration sub-system 430 may determine the signal processor output response for each grey-level channel, and correlate each signal processor response and the liquid crystal system response. The calibration sub-system 430 may perform measurements to determine the liquid crystal system response, select a plurality of discrete grey levels and determined the corresponding analog drive voltages, or obtain such data from elsewhere (e.g. an external system or an internal data storage). Thus, the calibration sub-system 430 may produce a look-up table (or equivalent algorithm) that can be used to identify the binary input voltage required by each grey-level channel to provide the correct analog output voltage level to drive pixels of the particular display device at each of the selected plurality of discrete grey levels. In operation, the calibration sub-system 430 or other suitable component of the driver may use the look-up table (or algorithm) to provide a feedback parameter 445 to each grey-level channel, where the feedback parameter 445 indicates the required binary input for the grey level currently assigned to the grey-level channel. Thus, the calibration sub-system 440 is able to individually control each grey-level channel to drive the display device, to compensate for variations as described herein.

In embodiments, viscosity changes in the liquid crystal are compensated by dynamically altering the response of the liquid crystal to voltage according to temperature to guarantee that the full range of grey levels—e.g. a full $2\pi$ phase—is achievable. In other embodiments, the response is altered according to the colour of the incident light for modulation.

In some embodiments, the system is arranged to change the grey-level response of the pixels and repeat the individual calibration of the single grey-level channels, to compensate for the random offset voltages experienced thereby, as described above. In some embodiments, the grey level response of the pixels is adjusted by changing the light modulating element of the pixels (i.e. a change internal to the pixel).

In some embodiments, a grey-level is assigned to each single grey-level channel and the digital input required by each single grey-level channel to achieve the respective assigned grey level is established. A look-up table may be used to record this information. For example, if it is determined that grey level 64 is required, the look-up table will identify which single grey-level channel—e.g. channel 12—has been assigned grey level 64 and extract the digital input—e.g. 0101h—required by channel 12 to achieve grey level 64. The output of channel 12 is then applied to the pixel (or even pixels) requiring grey level 64. In some embodiments, the assignment of grey levels to grey-level channels may be fixed, so that each single grey-level channel always provides an output voltage to drive pixels of a display device at a particular one of a plurality of discrete grey levels. In other embodiments, as described below, the assignment of grey levels to grey-level channels may be dynamically changed between display time intervals. In embodiments in which the assignment of grey levels to grey-level channels may be changed, the assignment of grey levels remains fixed for the duration of a display time interval, such as a sub-frame or frame.

Figure 8A:
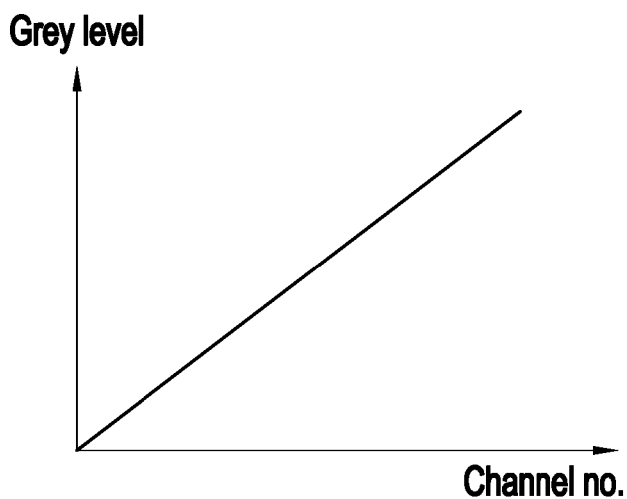
FIGS. 8A, 8B and 8C show three respective examples of the distribution of grey levels between the single grey-level channels.
Figure 8B:
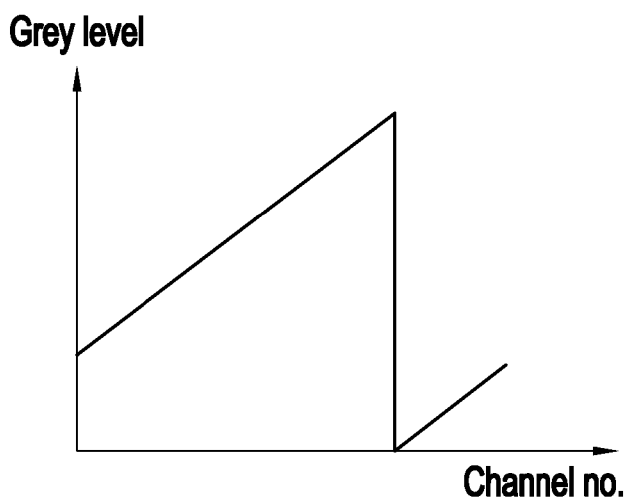
Figure 8C:
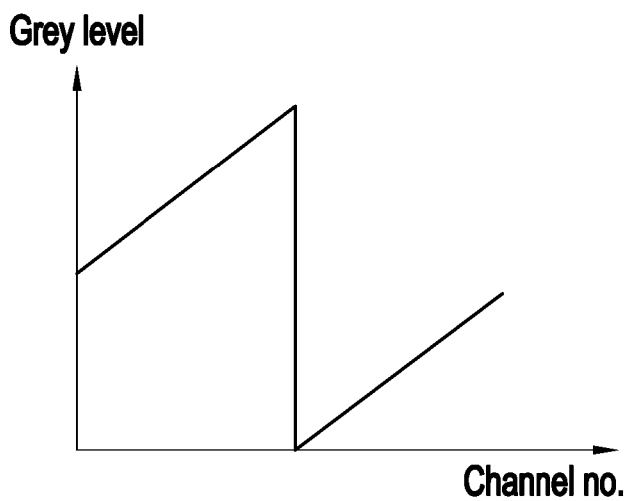

FIGS. 8A, 8B and 8C show example electro-optic responses of the drive circuit in accordance with some embodiments. More specifically, FIGS. 8A, 8B and 8C shows how the plurality of grey-level channels may be used to provide a respective plurality of grey levels—such as phase levels. FIG. 8A shows a first configuration in which the first channel provides the lowest grey level and each successive channel provides the next grey level. The last channel therefore provides the highest grey level. FIGS. 8B and 8C show respective second and third configurations in which successive channels generally provide the next grey level but the lowest grey-level channel is not at either extremity. Accordingly, there is a discontinuity in the grey level distribution. It may be said that a wrap-around distribution of grey levels between the channels is provided.

In some embodiments, the method comprises changing the distribution of grey levels between the channels. It may be said that the method comprises moving, changing or varying—including dynamically varying—the discontinuity in the wrap-around distribution. In some embodiments, the distribution of grey levels between the channels is changed during display—for example, between frames of a sequence of frames. In other embodiments, each frame is composed of or comprises identical or substantially identical sub-frames—e.g. because the display device requires a refresh—and the distribution is changed between sub-frames. That is, in some embodiments, the distribution is dynamically changed during display. It may be said that the method comprises changing the assignment of grey-levels between the single grey-level channels during display. The inventor has identified that the randomness introduced by dynamically changing the grey-level distribution between the single grey-level channels provides a despeckling effect in the image. This randomness is sufficient to at least partially compensate for the randomness of laser speckle. There is therefore provided a computational method of reducing speckle. An improved image is therefore provided. In some embodiments, the pixels are phase modulating pixels and the grey levels are phase values in the range 0 to $2\pi$, for example. In some embodiments, the phase-delay distribution between the channels is dynamically changed (e.g. shifted back and forth by $\pi/2$) in order to reduce the noise in the image caused by speckle.

In some embodiments, a look-up table is provided which dictates which channel is used to provide each grey-level and what digital input each channel requires to achieve the assigned grey-level. The look-up table may be generated based on the analysis from the calibration process and used during operation of the drive method.

Accordingly, methods are provided for driving a display device that uses a plurality of grey-level channels. Each grey-level channel comprises a signal processor that provides an output voltage at a voltage level for driving the pixels of the display at one of a plurality of discrete grey levels. The method compensates for random variations in the different grey-level channels, in particular random variations in the voltage offset of an op-amp in a signal processor of a DAC/op-amp pair, by means of a calibration process. Embodiments analyse one or more analog voltage outputs of each grey-level channel. Calibration may be performed based on the analysis. In some embodiments, the analysis compares an analog output voltage to a reference voltage (e.g. target voltage) for a grey-level channel. In these embodiments, the method individually calibrates each grey-level channel using a feedback parameter that changes a value of an electrical component thereof. Thus, each calibrated grey-level channel provides a target voltage output for the corresponding grey level. In other embodiments, the analysis determines the output response of each grey-level channel to a plurality of digital inputs across an operating range thereof. Based on the output response, the analysis further determines a digital input required to achieve a target analog output voltage corresponding to one or more of a plurality of grey levels. The plurality of grey levels may be selected based on the pixel (e.g. liquid crystal) response, and the corresponding analog output voltages determined therefrom. Thus, embodiments correlate the response of each grey-level channel to the grey level pixel response. Since each grey-level channel is calibrated across a range of voltages, it may be assigned to any one of the plurality of grey levels at any one time. Thus, the assignment of grey levels may be dynamically changed to introduce a randomness which at least partially compensates for laser speckle. Furthermore, when the assignment of grey levels is dynamically changed, the different grey-level channels provide voltages that produce a consistent pixel response for the same grey level.

It may be understood that the present disclosure provides techniques that compensate for the voltage offset of an op-amp of a signal processor of a single grey-level channel, to mitigate the disadvantages associated with the variation of the voltage offset experienced by different op-amps due to random variations. Accordingly, the embodiments described herein may not eliminate a voltage offset associated with each op-amp, but rather may compensate for the effects of the variation in the voltage offsets amongst the signal processors, and thus the multiple grey-level channels. In particular, embodiments aim to operate each single grey-level channel to provide an analog output voltage that is as close as possible to the desired or target voltage for the grey level assigned to that channel. The term "compensate/compensating for the voltage offset" should be understood in light of the above, and its meaning is not limited to eliminating or reducing a voltage offset experienced by an op-amp of a signal processor.

In embodiments, the spatially light modulator is a phase-only spatial light modulator. These embodiments are advantageous because no optical energy is lost by modulating amplitude. Accordingly, an efficient holographic projection system is provided. However, the present disclosure may be equally implemented on an amplitude-only spatial light modulator or an amplitude and phase modulator. It may be understood that the hologram will be correspondingly phase-only, amplitude-only or fully-complex.

In embodiments, the light source is a laser. In embodiments, the detector is a photodetector. In embodiments, the screen is a diffuser. The holographic projection system of the present disclosure may be used to provide an improved head-up display or head-mounted display. In embodiments, there is provided a vehicle comprising the holographic projection system.

Although groups of embodiments have been largely disclosed separately, any feature of any embodiment or group of embodiments may be combined with any other feature or combination of features of any embodiment or group of embodiments. That is, all possible combinations and permutations of features disclosed in the present disclosure are envisaged.

The quality of the holographic reconstruction may be affect by the so-called zero order problem which is a consequence of the diffractive nature of using a pixelated spatial light modulator. Such zero-order light can be regarded as "noise" and includes for example specularly reflected light, and other unwanted light from the SLM.

In the example of Fourier holography, this "noise" is focussed at the focal point of the Fourier lens leading to a bright spot, known as the "DC spot", at the centre of the holographic reconstruction. The zero order light may be simply blocked out however this would mean replacing the bright spot with a dark spot. Embodiments include an angularly selective filter to remove only the collimated rays of the zero order. Embodiments also include the method of managing the zero-order described in European patent 2,030,072 which is hereby incorporated in its entirety by reference.

Whilst embodiments described herein include displaying one hologram per frame on the spatial light modulator, the present disclosure is by no means limited in this respect and more than one hologram may be displayed on the SLM at any one time. For example, embodiments implement the technique of "tiling", in which the surface area of the SLM is further divided up into a number of tiles, each of which is set in a phase distribution similar or identical to that of the original tile. Each tile is therefore of a smaller surface area than if the whole allocated area of the SLM were used as one large phase pattern. The smaller the number of frequency component in the tile, and respectively the larger the number of tiles, the further apart the reconstructed pixels are separated when the image is produced. The image is created within the zeroth diffraction order, and it is preferred that the first and subsequent orders are displaced far enough so as not to overlap with the image and may be blocked by way of a spatial filter.

As mentioned above, the holographic reconstruction produced by this method (whether with tiling or without) comprises spots that form image pixels. The higher the number of tiles used, the smaller these spots become. If one takes the example of a Fourier transform of an infinite sine wave, a single frequency is produced. This is the optimum output. In practice, if just one tile is used, this corresponds to an input of a single cycle of a sine wave, with a zero values extending in the positive and negative directions from the end nodes of the sine wave to infinity. Instead of a single frequency being produced from its Fourier transform, the principle frequency component is produced with a series of adjacent frequency components on either side of it. The use of tiling reduces the magnitude of these adjacent frequency components and as a direct result of this, less interference (constructive or destructive) occurs between adjacent image pixels, thereby improving the image quality. Preferably, each tile is a whole tile, although embodiments use fractions of a tile.

In examples disclosed herein, three different colour light sources and three corresponding SLMs are used to provide composite colour. These examples may be referred to as spatially-separated colour, "SSC". In a variation encompassed by the present disclosure, the different holograms for each colour are displayed on different area of the same SLM and then combining to form the composite colour image. However, the skilled person will understand that at least some of the devices and methods of the present disclosure are equally applicable to other methods of providing composite colour holographic images.

One of these methods is known as Frame Sequential Colour, "FSC". In an example FSC system, three lasers are used (red, green and blue) and each laser is fired in succession at a single SLM to produce each frame of the video. The colours are cycled (red, green, blue, red, green, blue, etc.) at a fast enough rate such that a human viewer sees a polychromatic image from a combination of the three lasers. Each hologram is therefore colour specific. For example, in a video at 25 frames per second, the first frame would be produced by firing the red laser for 1/75th of a second, then the green laser would be fired for 1/75th of a second, and finally the blue laser would be fired for 1/75th of a second. The next frame is then produced, starting with the red laser, and so on.

An advantage of FSC method is that the whole SLM is used for each colour. This means that the quality of the three colour images produced will not be compromised because all pixels on the SLM are used for each of the colour images. However, a disadvantage of the FSC method is that the overall image produced will not be as bright as a corresponding image produced by the SSC method by a factor of about 3, because each laser is only used for a third of the time. This drawback could potentially be addressed by overdriving the lasers, or by using more powerful lasers, but this would require more power to be used, would involve higher costs and would make the system less compact.

An advantage of the SSC method is that the image is brighter due to all three lasers being fired at the same time. However, if due to space limitations it is required to use only one SLM, the surface area of the SLM can be divided into three parts, acting in effect as three separate SLMs. The drawback of this is that the quality of each single-colour image is decreased, due to the decrease of SLM surface area available for each monochromatic image. The quality of the polychromatic image is therefore decreased accordingly. The decrease of SLM surface area available means that fewer pixels on the SLM can be used, thus reducing the quality of the image. The quality of the image is reduced because its resolution is reduced.

Examples describe illuminating the SLM with visible light but the skilled person will understand that the light sources and SLM may equally be used to direct infrared or ultraviolet light, for example, as disclosed herein. For example, the skilled person will be aware of techniques for converting infrared and ultraviolet light into visible light for the purpose of providing the information to a user. For example, the present disclosure extends to using phosphors and/or quantum dot technology.

The methods and processes described herein may be embodied on a computer-readable medium. The term "computer-readable medium" includes a medium arranged to store data temporarily or permanently such as random-access memory (RAM), read-only memory (ROM), buffer memory, flash memory, and cache memory. The term "computer-readable medium" shall also be taken to include any medium, or combination of multiple media, that is capable of storing instructions for execution by a machine such that the instructions, when executed by one or more processors, cause the machine to perform any one or more of the methodologies described herein, in whole or in part.

The term "computer-readable medium" also encompasses cloud-based storage systems. The term "computer-readable medium" includes, but is not limited to, one or more tangible and non-transitory data repositories (e.g., data volumes) in the example form of a solid-state memory chip, an optical disc, a magnetic disc, or any suitable combination thereof. In some example embodiments, the instructions for execution may be communicated by a carrier medium. Examples of such a carrier medium include a transient medium (e.g., a propagating signal that communicates instructions).

Aspects of the present disclosure are set out below.

A display device comprising a drive circuit and corresponding method is provided. The drive circuit comprises a plurality of single grey-level channels, wherein each single grey-level channel comprises an input, an output and a signal processor connected between the input and output. Each signal processor is arranged to convert a digital signal received at the input into an analog voltage at the output, and comprises a digital-to-analog converter, "DAC", and an operational amplifier, "op-amp", having a voltage offset. A switching circuit is connected to the output of each single grey-level channel, wherein the switching circuit is arranged to switchably-receive the analog voltage of each single grey-level channel of the plurality of single grey-level channels. A calibration sub-system of circuit receives each analog voltage from the switching circuit and individually calibrates the voltage offset of each op-amp based on the received analog voltage for that grey-level channel. The calibration sub-system may be arranged to analyse the analog voltages, for example by comparing each analog voltage of a single grey-level channel to a corresponding reference voltage. Calibration may be performed based on the analysis.

In implementations, the calibration sub-system or circuit may be arranged to individually calibrate the voltage offset of each op-amp by individually selecting a feedback parameter for each op-amp. A look-up table may be provided, which identifies the feedback parameter for each op-amp based on the corresponding analog voltage received by the switching circuit. The feedback parameter may be the value of an electrical component of the op-amp, or the value of an electrical component in the associated op-amp circuit.

Each single grey-level channel provides a single grey level voltage. In examples, there are 128 single grey-level channels respectively providing 128 grey level voltages.

The display device may be a spatial light modulator, for example a Liquid Crystal on Silicon, "LCOS", spatial light modulator.

There is provided a method for calibrating a LCOS device having backplane comprising one DAC per grey level, wherein each DAC comprises an op-amp. The method comprises routing each of the 128 output voltages to an output pin using a switching circuit; measuring each output voltage; and using this measurement in conjunction with a target grey level voltage to minimise the voltage error in the op-amps.

There is provided a method for a display device comprising a drive circuit. The drive circuit comprises a plurality of single grey-level channels, wherein each single grey-level channel comprises an input, an output and a signal processor connected between the input and output. Each signal processor comprises a digital-to-analog converter, "DAC", and an operational amplifier, "op-amp", having a voltage offset. A digital signal received at the input is converted into an analog voltage at the output using each respective signal processor. An analog voltage of each single grey-level channel of the plurality of single grey-level channels is switchably-received, for example using a switching circuit connected to the output of each single grey-level channel. Each analog voltage is received, for example by a calibration sub-system from the switching circuit. The method individually compensates for the voltage offset of each op-amp based on the received analog voltage for that grey-level channel. For example, the received analog voltage for a grey-level channel is analysed. Based on the analysis, the drive circuit is operated to individually compensate for the voltage offset of each op-amp based on the received analog voltage for that grey-level channel.

In implementations, the display device comprises a plurality of pixels operable at a plurality of grey levels in accordance with a respective plurality of analog drive voltages. Each pixel is selectively-connectable to the output of any one single grey-level channel of the plurality of single grey-level channels. Each pixel may be arranged to modulate a parameter of light passing through the pixel, wherein each grey level is a modulation level. For example, the parameter is phase and each modulation level is a phase-delay level.

The digital signal received at the input may be an 8-bit binary signal.

In implementations, the output response of each single grey-level channel to a plurality of digital inputs is further determined. For each single grey-level channel, the digital input required to achieve each analog drive voltage at the output is determined, based on the output response of the single grey-level channel.

Individually determining the output response of each single grey-level channel may comprise measuring the output response of each single grey-level channel to a plurality of digital inputs. In implementations, interpolating between the measured output responses of that single grey-level channel may be used to determine the output response.

In implementations, the method comprises selecting the plurality of grey levels based on the grey level response of the pixels to analog voltage; and determining the plurality of analog drive voltages required by the pixels to achieve the respective plurality of grey levels based on the grey level response of the pixels.

The plurality of grey-levels may be evenly-spaced between a lower grey-level and an upper grey-level of each pixel, optionally, evenly-spaced between a minimum grey-level and a maximum grey-level of each pixel. However, any desired distribution (e.g. spacing) of the grey levels for the pixels is possible of a particular display device according to application requirements.

In implementations, a grey-level is assigned to each single grey-level channel and the method establishes the digital input required by each single grey-level channel to output the required analog voltage for the respectively-assigned grey-level. The assignment of grey-levels may be changed between the single grey-level channels during display, for example between display time intervals such as frames or sub-frames.

In implementations, the grey level response of the pixels to analog voltage may be changed. In this case, the method is repeated. Thus, the output response of each grey-level channel is correlated with the new grey level pixel response. Changing the grey level response of each pixel may comprise making a change internal to the pixel or a change external to the pixel.

It will be apparent to those skilled in the art that various modifications and variations can be made without departing from the scope of the appended claims. The present disclosure covers all modifications and variations within the scope of the appended claims and their equivalents.

The invention claimed is:

1. A drive method for a display device comprising a drive circuit, the display device comprising a plurality of pixels operable at a plurality of grey levels in accordance with a respective plurality of analog drive voltages, the drive circuit comprising a plurality of single grey-level channels, wherein each single grey-level channel comprises an input, an output and a signal processor connected between the input and output, wherein each signal processor comprises a digital-to-analog converter, "DAC", and an operational amplifier, "op-amp", having a voltage offset, the method comprising:
   converting a digital signal received at the input into an analog voltage at the output using each respective signal processor;
   switchably-receiving the analog voltage of each single grey-level channel of the plurality of single grey-level channels using a switching circuit connected to the output of each single grey-level channel;
   receiving each analog voltage from the switching circuit; and
   for each single grey-level channel, performing a calibration process to individually compensate for the voltage offset of each op-amp based on the received analog voltage for that grey level channel, wherein the calibration process comprises:
      individually determining the output response of each single grey-level channel to a plurality of digital inputs; and
      for each single grey-level channel, determining the digital input required to achieve each analog drive voltage at the output based on the individually-determined output response of the single grey-level channel,
   the method further comprising:
      selecting the plurality of grey levels based on the grey level response of the pixels to analog voltage; and
      determining the plurality of analog drive voltages required by the pixels to achieve the respective plurality of grey levels based on the grey level response of the pixels.

2. A method as claimed in claim 1 further comprising selectively-connecting each pixel to the output of any one single grey-level channel of the plurality of single grey-level channels.

3. A method as claimed in claim 1 wherein each pixel is arranged to modulate a parameter of light passing through the pixel, wherein each grey level is a modulation level.

4. A method as claimed in claim 3 wherein the parameter is phase and each modulation level is a phase-delay level.

5. A method as claimed in claim 1 wherein the digital signal received at the input is an 8-bit binary signal.

6. A method as claimed in claim 1 wherein individually determining the output response of each single grey-level channel comprises measuring the output response of each single-grey level channel to a plurality of digital inputs.

7. A method as claimed in claim 6 wherein individually determining the output response of each single grey-level channel further comprises, for each single grey-level channel, interpolating between the measured output responses of that single grey-level channel.

8. A method as claimed in claim 7 wherein the plurality of grey-levels are evenly-spaced between a lower grey-level and an upper grey-level of each pixel, optionally, evenly-spaced between a minimum grey-level and a maximum grey-level of each pixel.

9. A method as claimed in claim 1 further comprising assigning a grey-level to each single grey-level channel and establishing the digital input required by each single grey-level channel to output the required analog voltage for the respectively-assigned grey-level.

10. A method as claimed in claim 9 further comprising changing the assignment of grey-levels between the single grey-level channels during display.

11. A method as claimed in claim 1 further comprising changing the grey level response of the pixels to analog voltage and repeating the steps of:
   individually determining the output response of each single grey-level channel to a plurality of digital inputs; and
   for each single grey-level channel, determining the digital input required to achieve each analog drive voltage at the output based on the individually-determined output response of the single grey-level channel.

12. A method as claimed in claim 11 wherein changing the grey level response of each pixel comprises making a change internal to the pixel or a change external to the pixel.

13. A method as claimed in claim 1 wherein there are 128 single grey-level channels respectively providing 128 grey level voltages.

14. A method as claimed in claim 1 wherein the display device is spatial light modulator.

15. A method as claimed in claim 1 wherein the display device is a Liquid Crystal on Silicon, "LCOS", spatial light modulator.

16. A system including a display device comprising a drive circuit, the drive circuit comprising:
- a plurality of single grey-level channels, wherein each single grey-level channel comprises an input, an output and a signal processor connected between the input and output, wherein each processor is arranged to convert a digital signal received at the input into an analog voltage at the output, and wherein each signal processor comprises a digital-to-analog converter, "DAC", and an operational amplifier, "op-amp", having a voltage offset; and
- a switching circuit connected to the output of each single grey-level channel, wherein the switching circuit is arranged to switchably-receive the analog voltage of each single grey-level channel of the plurality of single grey-level channels, wherein the system further comprises:
- a calibration sub-system connected to each op-amp, wherein the calibration sub-system is arranged to receive each analog voltage from the switching circuit and, for each single grey-level channel, perform a calibration process to individually compensate for the voltage offset of each op-amp based on the received analog voltage for that grey level channel, wherein the calibration process comprises: individually determining the output response of each single grey-level channel to a plurality of digital inputs; and for each single grey-level channel, determining the digital input required to achieve each analog drive voltage at the output based on the individually-determined output response of the single grey-level channel,
- wherein the calibration sub-system is further arranged to select the plurality of grey levels based on the grey level response of the pixels to analog voltage; and determine the plurality of analog drive voltages required by the pixels to achieve the respective plurality of grey levels based on the grey level response of the pixels.

17. A system as claimed in claim 16 wherein the calibration sub-system is arranged to perform a drive method comprising:
- converting a digital signal received at the input into an analog voltage at the output using each respective signal processor;
- switchably-receiving the analog voltage of each single grey-level channel of the plurality of single grey-level channels using a switching circuit connected to the output of each single grey-level channel;
- receiving each analog voltage from the switching circuit; and
- for each single grey-level channel, performing a calibration process to individually compensate for the voltage offset of each op-amp based on the received analog voltage for that grey level channel, wherein the calibration process comprises:
    - individually determining the output response of each single grey-level channel to a plurality of digital inputs; and
    - for each single grey-level channel, determining the digital input required to achieve each analog drive voltage at the output based on the individually-determined output response of the single grey-level channel,
- the method further comprising:
    - selecting the plurality of grey levels based on the grey level response of the pixels to analog voltage; and
    - determining the plurality of analog drive voltages required by the pixels to achieve the respective plurality of grey levels based on the grey level response of the pixels; and
    - selectively-connecting each pixel to the output of any one single grey-level channel of the plurality of single grey-level channels.

* * * * *